United States Patent

Bürger et al.

[11] Patent Number: 4,536,909
[45] Date of Patent: Aug. 27, 1985

[54] APPARATUS FOR TREATING FLEXIBLE PRINTING PLATES PRODUCED BY PHOTOCHEMICAL METHODS

[75] Inventors: Arnulf Bürger; Karl-Heinz Scharff; Kurt Geiger; Günther Schnee; Hartwig Pieper, all of Ludwigshafen, Fed. Rep. of Germany

[73] Assignee: BASF Aktiengesellschaft, Ludwigshafen, Fed. Rep. of Germany

[21] Appl. No.: 583,205

[22] Filed: Feb. 24, 1984

[51] Int. Cl.³ .................. G03D 5/06; A46B 13/04
[52] U.S. Cl. ............................... 15/4; 15/77; 15/102
[58] Field of Search ............ 15/77, 100, 102, 4; 354/317, 319

[56] References Cited

U.S. PATENT DOCUMENTS

| 3,809,105 | 5/1974 | Horner | 15/100 |
| 3,995,343 | 12/1976 | Horner | 15/102 X |
| 4,129,919 | 12/1978 | Fitch | 15/102 |
| 4,303,330 | 12/1981 | Hehn et al. | 15/100 |
| 4,349,932 | 9/1982 | Schornig | 15/102 |

FOREIGN PATENT DOCUMENTS 2447922  4/1976  Fed. Rep. of Germany ........ 15/100

Primary Examiner—Edward L. Roberts
Attorney, Agent, or Firm—Keil & Weinkauf

[57] ABSTRACT

An apparatus for treating flexible printing plates produced by a photochemical method, wherein the upper rollers of the first four pairs of rollers are covered with velour and the lower rollers of these pairs of rollers and both the rollers of the fifth pair of rollers are covered with a textile fabric. With this apparatus it is possible to continuously wash out and clean even flexible printing plates which are very tacky after exposure and have a high relief image.

3 Claims, 1 Drawing Figure

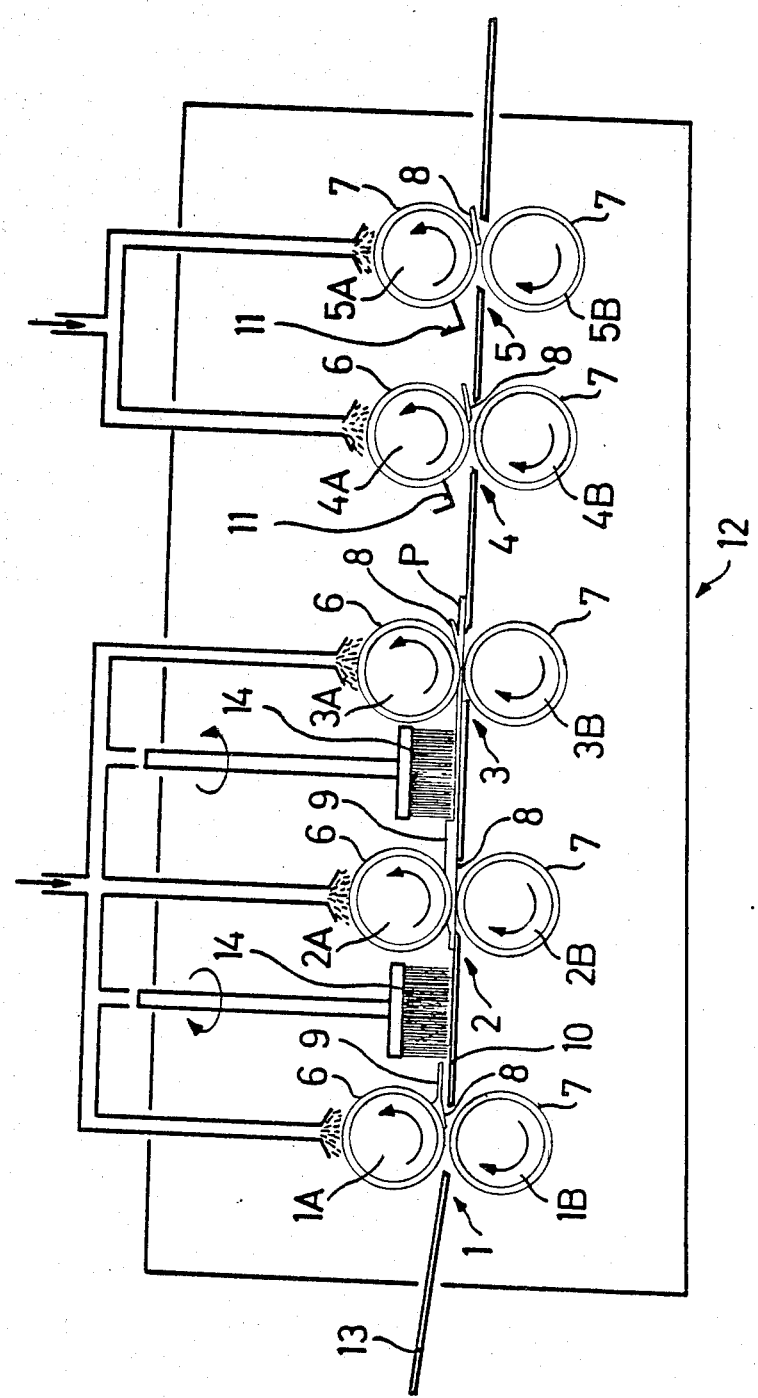

APPARATUS FOR TREATING FLEXIBLE PRINTING PLATES PRODUCED BY PHOTOCHEMICAL METHODS

The present invention relates to an apparatus for treating flexible printing plates produced by a photochemical method, in particular those produced from photo-polymerizable substances and exposed with actinic light, in which the plates are washed out and cleaned in a closed housing by means of rotating brushes and rollers to which washout liquid is supplied, and are transported over a table located between the rollers by means of the rollers, and the first three pairs of rollers effect transportation while the two subsequent pairs of rollers effect cleaning and partial drying in addition to transportation.

Flexible printing plates produced by a photochemical method are used principally for printing packaging material and endless forms.

It is known that printing plates can be exposed imagewise and then washed out with a washout solution, ie. the material of the non-exposed areas of the printing plate is removed by means of washout solution during the washout operation. Apparatus of very diverse types have been used for this purpose, for example an apparatus comprising a rotating drum which is located in a closed housing and on which the flexible printing plate is clamped, and several brush rollers which are located around the circumference of the drum, rotate in the same direction as, and in the opposite direction to, the drum, and are sprayed with washout solution. By means of these brush rollers and the washout solution, the abovementioned material is removed from the exposed printing plate.

However, this apparatus, which at present is the principal one used for flexible printing plates, has various disadvantages; for example, the housing has to be opened in order to clamp the printing plate on the drum or to remove the plate from the drum, so that in spite of elaborate extraction units the operator comes into contact with the solvent vapors from the washout solution, and, depending on the quality of the extraction units, the maximum allowable concentration (MAC value) may in some cases be exceeced. Furthermore, the operator has to remove the wet printing plate manually from the drum after the washout process and place it in a drying apparatus. A further disadvantage of this type of washout apparatus is that it is only capable of treating printing plates which do not exceed the maximum size that can be accommodated therein. Moreover, the conventional apparatus require long washout times, ie. the time during which washout solution and printing plate are in contact is extremely long, substantially reducing the washout capacity on the one hand and producing deformation or even destruction of fine relief sections on the exposed printing plate on the other hand; this in turn adversely affects the quality of the prints.

Furthermore, apparatus for treating printing plates that are only slightly tacky after exposure and have a low relief height and high stability, which avoid the above disadvantages, are known from related areas of reprography.

It is an object of the present invention to provide an apparatus which does not have the disadvantages of these conventional apparatus and which can also be employed for flexible printing plates that at the same time are very tacky after exposure and have a high relief image. For this purpose, however, it was necessary to overcome the problem of transporting the flexible printing plates within the apparatus, since such plates cannot be further transported on smooth rollers.

We have found that this object is achieved, in accordance with the invention, primarily by an apparatus in which the three upper transport rollers and the upper cleaning roller downstream of the pairs of transport rollers are covered with velour, the corresponding lower rollers and both rollers of the second pair of cleaning rollers are covered with a textile fabric, and peeling members are located, parallel to the roller axis, at all of the upper rollers, the peeling members at the first and second upper transport rollers being equipped with hold-down means.

Further details of the invention are disclosed in the following description of an embodiment given by way of example and illustrated in the accompanying drawing, which is a longitudinal section through the novel apparatus.

In a closed housing 12, three pairs of transport rollers 1, 2 and 3 and two pairs of cleaning rollers 4 and 5 are arranged in succession and equally spaced. A horizontal, flat table 10 is located between adjacent pairs of rollers, and a sloping loading table 13 is located upstream of the first pair of transport rollers 1, outside the closed housing 12. Between each of the roller pairs 1—2 and 2—3, brushes 14 which rotate in opposite directions are located at right angles to the exposed printing plate; washout solution is fed to the center of each of these brushes. A spray device for supplying washout solution to the pairs of rollers is mounted above each of the five pairs of rollers. Rollers 1A, 2A, 3A and 4A are covered with velour 6, while rollers 5A, 1B, 2B, 3B, 4B and 5B are covered with textile fabric.

Rollers 1A and 2A are provided with peeling members 8 and hold-down means 9, while rollers 3A, 4A and 5A are equipped only with peeling members 8. Peeling members 8 are mounted so as to make rubbing contact with the rollers. In addition, doctor blades 11 are mounted at rollers 4A and 5A, and extend over the entire width of the rollers. Downstream of the pair of cleaning rollers 5, a drying unit is attached directly to the closed housing 12.

To illustrate the design of the novel apparatus, the procedure for washing out, cleaning and partially drying the exposed printing plates will now be described. The exposed printing plate is fed into the closed housing and to the first pair of transport rollers via the sloping loading table. The plate is then transported continuously through the closed housing by means of five pairs of rollers, and the washed out, cleaned and partially dried printing plate is continuously fed into the drying unit. The non-exposed material is washed out by means of the brushes and the washout solution, which is fed to the center of the brushes and is also sprayed onto the pairs of transport rollers. The peeling members which rub against the rollers prevent the printing plate from adhering to the rollers, so that the plates slide further along the table, and the hold-down means prevent the printing plates from lifting up off the table. After they have been washed out, the printing plates are cleaned by means of the cleaning rollers sprayed with washout solution; the doctor blades remove part of the washout liquid and hence render the velour or textile fabric covering absorptive, with the result that partial drying of the exposed, washed out and cleaned printing plate is achieved. The washout solution for the brushes and the transport rollers is circulated until a certain degree of saturation with material is reached, but fresh washout solution is used for the cleaning rollers.

The particular advantages of the apparatus of the invention are as follows: it is not necessary to open the housing in order to introduce or remove the printing plate, and the maximum allowable concentration (MAC value) can therefore be maintained; manual removal of the wet printing plates from the housing by the operator is dispensed with; the length of the printing plate is in no way restricted; and the washout time is substantially reduced which, for the above reasons, results in better quality of the prints.

We claim:

1. An apparatus for treating flexible printing plates produced by a photochemical method, in particular those produced from photopolymerizable substances and exposed with actinic light, which apparatus comprises a housing through which the plates are transported and in which they are washed out and cleaned, said housing including five roller pairs which are mutually spaced in the direction of transport of the plates, table sections which are located between said roller pairs and over which the plates are transported by the rollers, and brushes located between the roller pairs, rotating about axes normal to said table sections and having washout liquid supplied thereto, the first three pairs of rollers effecting transportation while the two subsequent pairs of rollers effect cleaning and partial drying in addition to transportation, wherein the three upper transport rollers and the first upper cleaning roller downstream of the pairs of transport rollers are covered with velour, the corresponding lower rollers and both rollers of the second pair of cleaning rollers are covered with a textile fabric, and peeling members are located, parallel to the roller axis, at all of the upper rollers, the peeling members at the first and second upper transport rollers being equipped with hold-down means.

2. An apparatus as claimed in claim 1, wherein the peeling members are mounted so as to make rubbing contact with the rollers, and the hold-down means are arranged at a distance from the table which corresponds to the thickness of the printing plate.

3. An apparatus as claimed in claim 1 wherein the pairs of cleaning rollers are provided with doctor blades.

* * * * *